United States Patent [19]
Roemer et al.

[11] Patent Number: 5,742,164
[45] Date of Patent: Apr. 21, 1998

[54] MISALIGNMENT COMPENSATION FOR MR GRADIENT COIL ASSEMBLY

[75] Inventors: Peter B. Roemer, North Andover, Mass.; William D. Barber, Clifton Park, N.Y.

[73] Assignee: General Electric Company, Milwaukee, Wis.

[21] Appl. No.: 579,755

[22] Filed: Dec. 28, 1995

[51] Int. Cl.$^6$ .................................. G01V 3/00; G01V 3/14
[52] U.S. Cl. ........................................... 324/318; 324/322
[58] Field of Search ...................... 324/300, 318, 324/322, 307, 301, 303, 316, 321

[56] References Cited

U.S. PATENT DOCUMENTS

| | | | |
|---|---|---|---|
| 4,737,716 | 4/1988 | Roemer et al. | 324/319 |
| 4,920,316 | 4/1990 | Egloff | 324/318 |
| 5,111,147 | 5/1992 | Aubert | 324/318 |
| 5,289,128 | 2/1994 | DeMeester et al. | 324/318 |
| 5,481,191 | 1/1996 | Rzedzian | 324/318 |

*Primary Examiner*—Sandra L. O'Shea
*Assistant Examiner*—Mack Haynes
*Attorney, Agent, or Firm*—James O. Skarsten; John H. Pilarski

[57] ABSTRACT

The invention is directed to a gradient coil assembly for MR imaging which includes a gradient coil set comprising inner and outer gradient coils, the inner gradient coil located within the outer gradient coil and surrounding or otherwise proximate to an imaging volume. The system further includes means for selectively energizing the inner and outer gradient coils to generate a resultant gradient field in the imaging volume. The energized inner and outer gradient coils are also disposed to collectively generate an eddy current field component in a region between the outer coil and a conductive structure spaced-apart therefrom when the inner gradient coil is displaced along an axis from a specified position with respect to the outer gradient coil. A compensation coil is selectively positioned with respect to the inner and outer gradient coils, and means are provided for applying a compensation current to the compensation coil to generate a magnetic field which substantially cancels the eddy current component, the compensation current and the displacement of the inner coil along the axis from the specified position having a specified relationship.

12 Claims, 2 Drawing Sheets

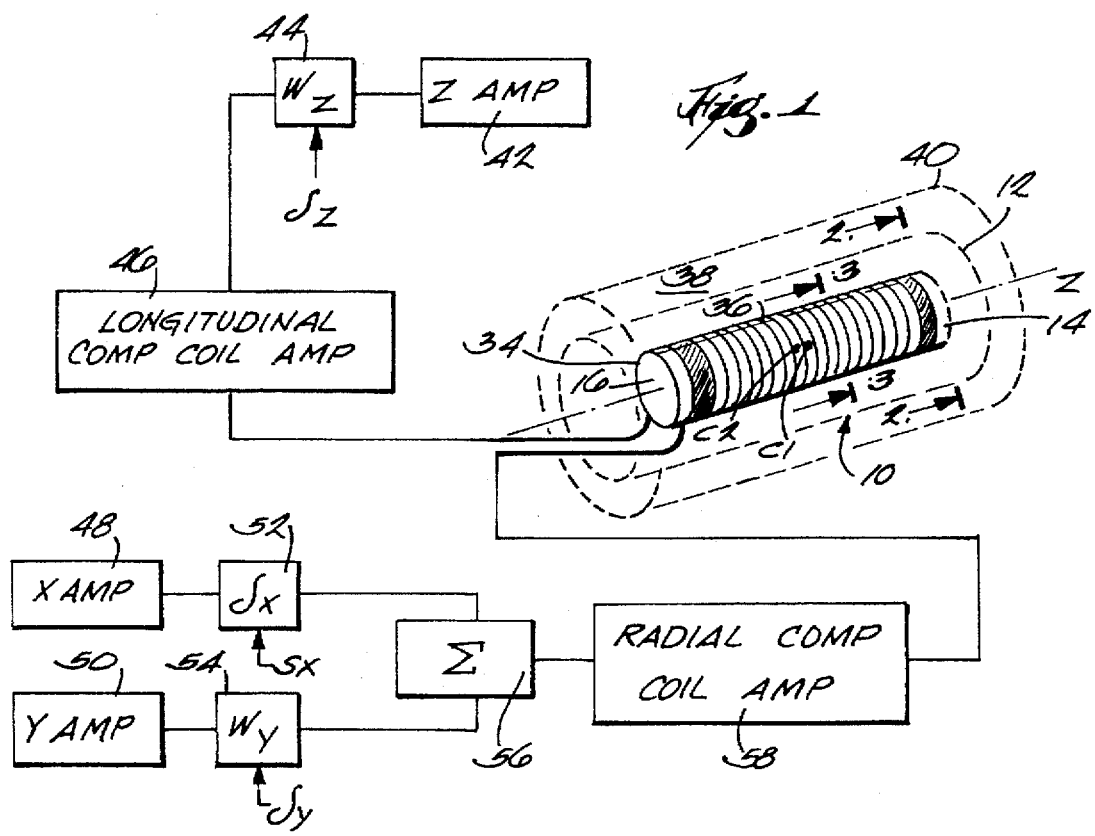
Fig. 1
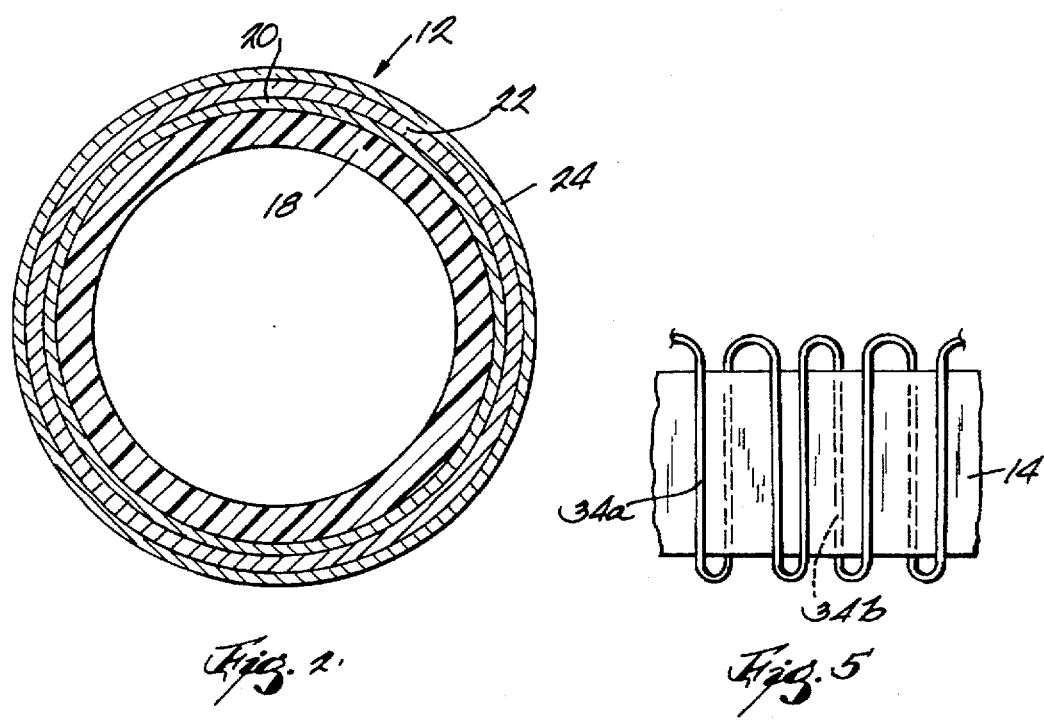
Fig. 2.
Fig. 5.

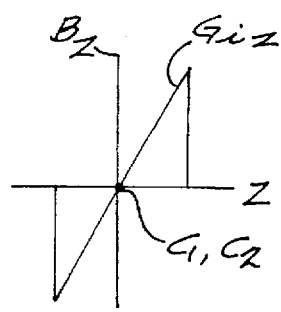
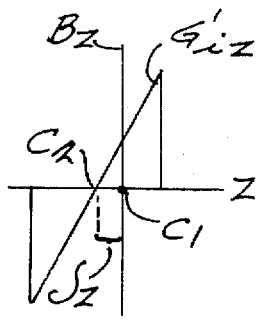
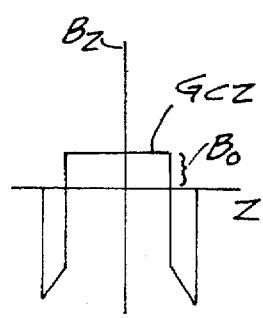
Fig. 4a    Fig. 4b    Fig. 4c
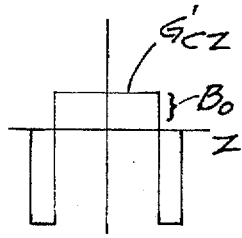
Fig. 4d
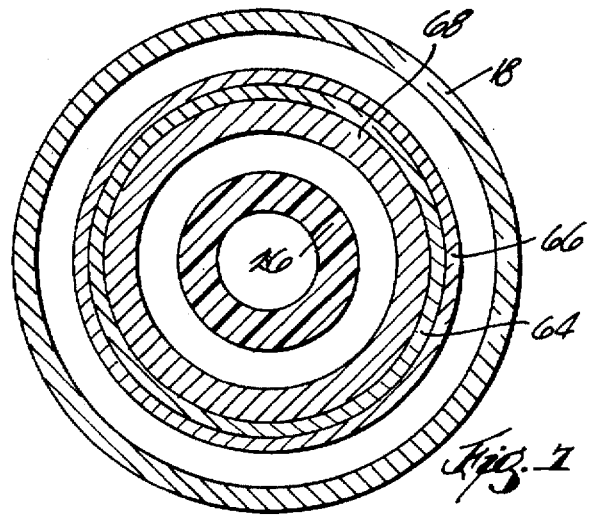
Fig. 7
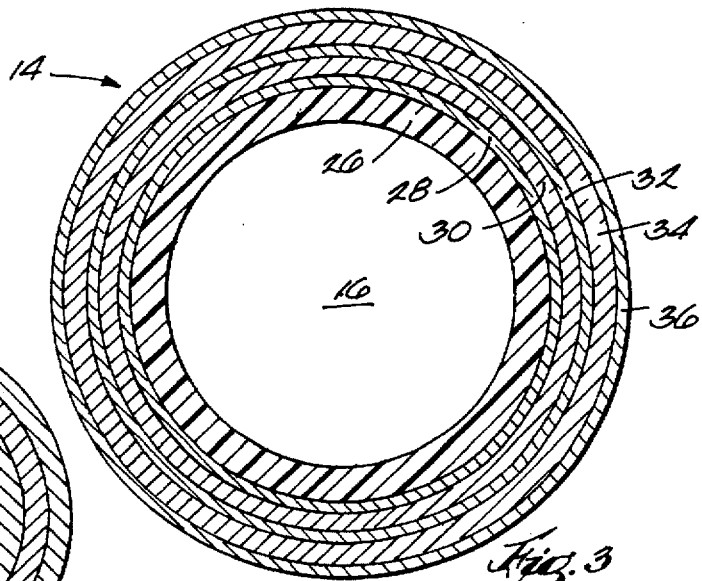
Fig. 3
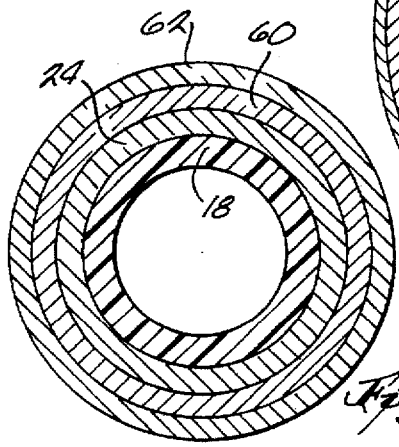
Fig. 6

MISALIGNMENT COMPENSATION FOR MR GRADIENT COIL ASSEMBLY

BACKGROUND OF THE INVENTION

The invention disclosed and claimed herein generally pertains to an improved gradient coil arrangement for a magnetic resonance (MR) imaging system. More particularly, the invention pertains to such arrangement wherein a gradient field is produced by a shielded pair or set of gradient coils, and it is intended to prevent undesirable effects resulting from misalignment between the two coils.

It has become well known in MR imaging to employ a gradient coil pair or set, also known as a self-shielded or Roemer gradient coil set, to generate respective X-, Y- and Z-gradient fields, which respectively correspond to mutually orthogonal X-, Y- and Z-axes. Generally, a gradient coil set has two cylindrical gradient coils, one of the coils having a greater diameter than the other, and the coils being in spaced-apart coaxial relationship within the bore of the associated MR magnet. Thus, each coil set comprises an inner and an outer gradient coil. The coils of a set are actuated or energized by a current, which is typically the same current for both coils, to produce a magnetic field. The two coils are designed in relation to each other so that their fields combine within the magnet bore, where a subject of MR imaging is located, to produce one of the gradient magnetic fields. It is intended that the fields of the two coils further combine outside the outer coil to produce a resultant substantially zero field. A gradient coil pair or set of such type is described, for example, in commonly assigned U.S. Pat. No. 4,737,716, issued Apr. 12, 1988 to Roemer, et al, for which re-examination certificate B1 4,737,716 was subsequently issued.

It is now common practice in an MR imaging system to place the outer coils for X-, Y- and Z-gradient coil sets on a common cylindrical outer coil form, and to place the corresponding inner X-, Y- and Z-coils on a common cylindrical inner coil form located within the outer form. Hereinafter, the outer coil form and the coils carried thereon are referred to collectively as the "outer coil assembly", and the inner coil form and the coils carried thereon are referred to collectively as the "inner coil assembly". Both coil assemblies are in turn placed in a cryostat or other conductive structure associated with the main magnetic field of the MR system. Because the outer coils of respective gradient coil sets are surrounded by such structure, it is very important that the region between the structure and the outer coil assembly not contain any magnetic field components resulting from operation of the gradient coils. Gradient fields can vary rapidly in time, so that significant eddy currents could be induced thereby in the surrounding conductive structure. Such eddy current would, in turn, produce eddy current magnetic field components which could modify or alter the main magnetic field of the MR system.

In the gradient coil set arrangement described above, the isocenters of the inner and outer gradient coil assemblies are in coincident relationship, and their respective axes align with each other to a very high level of precision, such as to within 0.2–0.5 millimeters as measured along the respective X-, Y- and Z-axes. If such precision alignment between the inner and outer coil assemblies is in fact achieved, the respective shielded gradient coil sets will, upon being energized, respectively produce the desired zero resultant field in the region outside the outer coil assembly, as described above. However, if the inner coil assembly axis is offset or displaced from the outer coil assembly axis by on the order of 1–3 millimeters or more, along any of the three orthogonal axes, a magnetic field component will be generated in the outer region. Each of such components, will, in turn, produce an undesirable eddy current field component. Of particular concern are zero order eddy current field components, also referred to as B0 eddy current. Offset errors of such magnitude are very common in the process of fabricating gradient coil set arrangements of the above type, wherein an inner coil assembly of substantial mass must be placed within an outer coil assembly. Misalignment is particularly significant for high speed MR imaging.

In the past, misalignment between inner and outer gradient coil assemblies was corrected by placing jack bolts around the space between the two coil assemblies. By selectively varying the lengths of respective jack bolts, the inner coil assembly could be mechanically shifted into alignment with the outer coil assembly. However, it has become common practice to fill the space between the inner and outer gradient coil assemblies with a layer of epoxy. If the two coil assemblies are in a misaligned relationship after the epoxy cures or hardens, such mechanical technique for off-set correction clearly cannot be used.

SUMMARY OF THE INVENTION

The invention is directed to a gradient coil assembly for MR imaging which includes a gradient coil set comprising inner and outer gradient coils, the inner gradient coil located within the outer gradient coil and surrounding or otherwise proximate to an imaging volume. The system further includes means for selectively energizing the inner and outer gradient coils to generate a resultant gradient field in the imaging volume. The energized inner and outer gradient coils are also disposed to collectively generate an eddy current field component in a region between the outer coil and a conductive structure spaced-apart therefrom when the inner gradient coil is displaced along an axis from a specified position with respect to the outer gradient coil. A compensation coil is selectively positioned with respect to the inner and outer gradient coils, and means are provided for applying a compensation current to the compensation coil to generate a magnetic field which substantially cancels the eddy current component, the compensation current and the displacement of the inner coil along the axis from the specified position having a specified relationship.

In a preferred embodiment, the amplitude of the compensation current is proportional to the displacement of the inner gradient coil. The energizing means comprises means for coupling a gradient drive current to both the inner and outer gradient coils, and the compensation current has the same waveform shape with respect to time as the drive current.

Preferably, the system is provided with longitudinal and transverse, or radial, compensation coils. The longitudinal coil is provided with a compensation current proportional to the drive current for the Z-gradient coil set to compensate for misalignment of the inner Z-gradient coil along the Z-axis. The transverse compensation coil is energized to correct misalignments with respect to both the X and Y axes.

OBJECTS OF THE INVENTION

An object of the invention is to provide a gradient coil system for MR imaging which compensates for eddy current components, and particularly for an eddy current B0 field resulting from misalignment between the axes of inner and outer gradient coil forms or assemblies.

Another object is to provide a system of the above type which employs electrical means to achieve the same effect in eliminating B0 eddy currents which would result by physically or mechanically shifting the inner coil form from a misaligned position to an aligned position, with respect to the outer coil form.

Another object is to provide a system of the above type which employs two compensation coils to cancel out B0 eddy current effects, one coil for canceling eddy currents resulting from longitudinal misalignment of the inner coil form, and the other to cancel eddy current effects resulting from transverse or radial misalignment of the inner coil form.

These and other objects of the invention will become more readily apparent from the ensuing specification, taken together with the accompanying drawings.

BRIEF DESCRIPTION OF THE DRAWINGS

FIG. 1 is a schematic diagram showing an embodiment of the invention.

FIG. 2 is a sectional view taken along lines 2—2 of FIG. 1.

FIG. 3 is a sectional view taken along lines 3—3 of FIG. 1.

FIGS. 4a–d show a set of magnetic field diagrams for illustrating the embodiment of the invention.

FIG. 5 shows a portion of a compensation coil for the embodiment of FIG. 1 in greater detail.

FIG. 6 shows a first modification of the invention

FIG. 7 shows a second modification of the invention

DETAILED DESCRIPTION OF THE PREFERRED EMBODIMENT

Referring to FIG. 1, there is shown a gradient coil assembly 10 for use with an MR imaging system, assembly 10 comprising a cylindrical outer coil assembly 12, and a cylindrical inner coil assembly 14 contained therein. MR imaging is intended to take place in a volume 16, located within the bore of inner coil assembly 14, and away from the ends thereof. Assemblies 12 and 14 are in alignment if their respective isocenters $C_1$ and $C_2$ are in coincidence, and if the axis of inner assembly 14 is in coaxial relationship with the axis of outer assembly 12, which is shown in FIG. 1 to lie along the Z-axis of a set of mutually orthogonal X-, Y- and Z-axes. Inner assembly 14 is longitudinally misaligned if its isocenter $C_2$ is offset along the Z-axis from $C_1$ by more than on the order of 1 millimeter, and is transversely misaligned if its axis is offset by on the order of 1 millimeter or more along either the X- or Y-axis.

As best shown in FIG. 2, outer coil assembly 12 includes a coil form 18, comprising a rigid cylindrical member, and further includes an outer Z-gradient coil 20, an outer Y-gradient coil 22 and an outer X-gradient coil 24, the gradient coils being respectively carried on outer coil form 18 in a layered arrangement. As best shown in FIG. 3, inner coil assembly 14 includes a coil form 26, likewise comprising a rigid cylindrical member, and an inner Z-gradient coil 28, an inner Y-gradient coil 30 and an inner X-gradient coil 32, which are respectively carried on inner coil form 26 in a layered arrangement. Misalignment compensation coils 34 and 36, described hereinafter, are also carried on coil form 26.

Outer and inner Z-gradient coils 20 and 28 together comprise a shielded coil set of the type described above. Thus, when they are energized by a Z-gradient drive current, they collectively produce a Z-gradient magnetic field in MR imaging volume 16, and a zero field in a region 38 if coil assemblies 12 and 14 are aligned along the Z-axis. FIG. 1 shows region 38 located between outer assembly 12 and a conductive structure 40, which is positioned around assembly 12 in spaced-apart relationship. Conductive structure 40 comprises, for example, the cryostat of an MR system with which gradient coil assembly 10 is used.

In like manner, coils 22 and 30 comprise a Y-gradient coil set for producing a Y-gradient magnetic field in imaging volume 16, and coils 24 and 32 comprise an X-gradient coil set for producing an X-gradient field in imaging volume 16. The Y- and X-gradient coil sets both produce zero field in region 38 if the axis of inner assembly 14 is not displaced from the Z-axis along either the Y- or X-axis.

Referring to FIG. 4(a), there is shown a plot of field strength $B_z$ versus Z-axis position for the field $G_{iz}$. $G_{iz}$ is the field produced by inner Z-gradient coil 28 when coil assemblies 12 and 14 are aligned along the Z-axis so that isocenters $C_1$ and $C_2$ coincide as stated above. Referring to FIG. 4(b), there is shown a plot of the field $G'_{iz}$, i.e., the field produced by Z-gradient coil 28 when inner coil assembly 14, and therefore coil 28, are longitudinally misaligned. More particularly, $G'_{iz}$ is the field produced by coil 28 when assembly 14 and the coils carried thereby are displaced along the Z-axis to the left as viewed in FIG. 4(b) by an amount $*_z$, where $*_z$ is on the order of 1 millimeter or more. Because of such offset, the resultant field produced by Z-gradient coils 20 and 28 will be non-zero in the region 38. Such non-zero field component will produce an eddy current in the conductive structure 40, which, as described above, can produce an undesirable B0 eddy current field in the region 38.

Referring to FIG. 4(c), there is shown the field $G_{cz}$ which comprises the difference between fields $G_{iz}$ and $G'_{iz}$ at respective points along the Z-axis. In accordance with the invention, it has been recognized that if a field having the pattern of field $G_{cz}$ is generated in region 38, coincident in time with the field $G'_{iz}$, B0 eddy current can be generated in structure 40 which is equal and opposite to the B0 eddy current resulting from Z-gradient coil misalignment. The opposing eddy currents cancel each other, thus preventing a B0 eddy current field.

It will be observed that field $G_{cz}$ has a constant strength $B_o$ over the length of coil 28, except toward the ends thereof. If, is comparatively small, such as on the order of a few millimeters, a reasonable approximation for the compensation field $G_{cz}$ is the field $G'_{cz}$, shown in FIG. 4(d). It will be further observed that the strength $B_o$ of fields $G_{cz}$ and $G'_{cz}$ is directly proportional to the offset $*_z$. For a given offset $*_z$, generating a field $G'_{cz}$ of corresponding strength $B_o$ has the effect of shifting the Z-gradient field from the asymmetrical relationship with the Z-axis shown in FIG. 4(b) to the symmetrical relationship shown in FIG. 4(a).

Field $G'_{cz}$ may be generated by the single longitudinal compensation coil 34, wound around the inner gradient coils on coil form 26, as best shown in FIG. 3. Coil 34 comprises a number of coil turns, which are positioned along the Z-axis, relative to isocenter $C_1$, at selected distances. Table 1, below, shows the respective locations for the turns of a coil usefully employed for longitudinal compensation coil 34, respective coil turns having a diameter on the order of 28 inches. Table 1 indicates that coil turns are located at both positive and negative Z-axis positions, as measured from isocenter $C_1$. Some of the turns are wound to have a different direction of current flow than other turns. Accordingly, Table 1 also shows sense of current flow for respective coil turns, by either a "1" or "−1".

TABLE 1

| z location (inches) | current sense |
| --- | --- |
| 1.231 | 1 |
| 3.693 | 1 |
| 6.118 | 1 |
| 8.415 | 1 |
| 10.380 | 1 |
| 11.672 | 1 |
| 12.397 | 1 |
| 12.820 | 1 |
| 13.143 | 1 |
| 13.444 | 1 |
| 13.773 | 1 |
| 14.262 | 1 |
| 15.775 | −1 |
| 16.227 | −1 |
| 16.584 | −1 |
| 16.977 | −1 |
| 17.577 | −1 |
| 18.502 | −1 |
| 19.115 | −1 |
| 19.508 | −1 |
| 19.853 | −1 |
| 20.237 | −1 |
| 20.852 | −1 |
| 22.751 | −1 |

Referring to FIG. 5, there are shown two adjacent coil turns 34a and 34b, wherein the coils are respectively wound so that the sense of current flow changes, as the current flows from coil turn 34a to coil turn 34b.

As indicated above, the compensation field $G'_{cz}$ must coincide in time with the misaligned field $G'_{iz}$ of FIG. 4(b). This is achieved by driving longitudinal compensation coil 34 with a portion of the Z-gradient drive current. Thus, referring again to FIG. 1, there is shown the output of Z-gradient drive amplifier 42 coupled to a weighting device 44, which also receives a signal representing the offset $*_z$. Device 44 operates to apply a weighting value to the Z-gradient drive current which is proportional to $*_z$. The weighted current from device 44 is coupled as the input to longitudinal compensation amplifier 46, which drives compensation coil 34. If amplifier 42 provides a full drive current on the order of 180–200 Amps, respective parameters of device 44 and amplifier are selected to provide a compensation coil drive current of approximately 2 amps for a $*_z$ offset on the order of 1 millimeter. Thus, compensation coil 34 is driven by a current having the same waveform, as a function of time, as the Z-gradient drive current.

It has been found that radial misalignments of inner coil assembly 14, and B0 eddy current fields resulting therefrom, can be compensated by a single coil 36. FIGS. 1 and 3 show coil 36 wrapped around coil assembly 14, over coil 34. Table 2, below, shows the respective locations along the Z-axis, measured from $C_1$, for the turns of a coil usefully employed as radial compensation coil 36.

TABLE 2

| z location (inches) | current sense |
| --- | --- |
| 4.449 | 1 |
| 6.993 | 1 |
| 8.965 | 1 |
| 10.426 | 1 |
| 11.422 | 1 |
| 12.128 | 1 |
| 12.672 | 1 |
| 13.774 | −1 |
| 14.322 | −1 |
| 15.007 | −1 |
| 15.982 | −1 |
| 17.346 | −1 |
| 19.135 | −1 |
| 21.213 | −1 |
| 23.196 | −1 |
| 24.718 | −1 |
| 25.743 | −1 |
| 27.472 | 1 |
| 30.213 | 1 |

To drive coil 36, the X- and Y-gradient drive currents are coupled from X- and Y-gradient amplifiers 48 and 50, respectively, to weighting devices 52 and 54, similar to device 44. A signal representing offset $*_x$, the displacement of the axis of inner coil assembly 14 from the Z-axis along the x-axis, is also coupled to weighting device 52. Similarly, a signal representing offset $*_y$ is coupled to weighting device 54. Thus, the outputs of devices 52 and 54 respectively comprise the waveforms of the X- and Y-drive currents, the amplitudes thereof being adjusted in corresponding relationship with $*_x$ and $*_y$, respectively. The outputs of devices 52 and 54 are coupled as inputs to summing device 56. The resultant sum of such outputs is coupled as the input to radial compensation coil amplifier 58, which drives the coil 36. Thus, the radial compensation coil is driven by two current components, one representing offset $*_x$ and the other representing offset $*_y$.

It is to be understood that in a modification of the invention, either or both of the compensation coils could be wound around the outer gradient coils on coil form 18, rather than inner form 26. FIG. 6 shows a longitudinal compensation coil 60 and a radial compensation coil 62 both carried on outer coil form 18. (Coils 20 and 22 not shown).

In a second modification, either or both of the compensation coils could be carried on a rigid cylindrical coil form selectively positioned between inner coil form 26 and outer coil form 18. FIG. 7 shows compensation coils 64 and 66 both carried on a coil form 68 of such type, which is in coaxial relationship with forms 18 and 26.

It will be readily appreciated that in the above modifications, the compensation coil currents and the spacings between turns thereof will be different from those used for coils 34 and 36 carried on inner gradient coil form 26. (Gradient coils not shown).

Obviously, many other modifications and variations of the present invention are possible in light of the above teachings. It is therefore to be understood that within the scope of the enclosed concept, the invention may be practiced otherwise than as specifically described.

What is claimed is:

1. A gradient coil system for MR imaging comprising:
   a first gradient coil set comprising first inner and outer gradient coils, said first inner gradient coil located within said first outer gradient coil and proximate to an imaging volume;
   a second gradient coil set comprising second inner and outer gradient coils, said second inner gradient coil located within said second outer gradient coil proximate to said imaging volume;

means for selectively energizing said first inner and outer gradient coils to generate a resultant first gradient field in said imaging volume, said energized first inner and outer gradient coils also disposed to collectively generate a first eddy current field component in a region between said outer coil and a conductive structure spaced apart therefrom when said inner gradient coil is displaced by a given amount from a specified position with respect to said outer gradient coil along a first axis;

said energizing means further comprising means for selectively energizing said second inner and outer gradient coils to generate a resultant second gradient field in said imaging volume, said energized second inner and outer gradient coils also disposed to collectively generate a second eddy current field component in said region when said second gradient coil is displaced from a specified position with respect to said second outer gradient coil along a second axis in mutually orthogonal relationship with said first axis;

a compensation coil selectively positioned with respect to said first and second inner and outer gradient coils; and means for applying a compensation current to said compensation coil, said compensation current comprising first and second current components, the first current component having a specified relationship to the displacement of said first inner gradient coil along said first axis, and said second current component having a specified relationship to the displacement of said second inner gradient coil along said second axis, said compensation current energizing said compensation coil to generate a magnetic field substantially canceling both said first and second eddy current components in said region.

2. A gradient coil system for MR imaging comprising:

a cylindrical outer coil form having a first isocenter, the axis of said outer coil form comprising a Z-axis;

a cylindrical inner coil form positioned within said outer coil form and surrounding an imaging volume, said inner coil form having a second isocenter;

inner and outer gradient coil means respectively carried on said inner and outer coil forms for collectively generating a specified gradient field pattern in said imaging volume, and a substantially zero field in a region outside said outer coil, when said first and second isocenters of said inner and outer coil forms, respectively, are in coincidence;

a longitudinal compensation coil selectively positioned with respect to said inner and outer gradient coil means;

a single radial compensation coil selectively positioned with respect to said inner and outer gradient coil means;

first coil activation means for applying a first compensation current to said longitudinal coil to generate a magnetic field substantially canceling an eddy current field component generated by said inner and outer gradient coil means when said inner coil form is positioned with respect to said outer coil form so that said first isocenter is offset from said second isocenter along said Z-axis; and second coil activation means for applying a second compensation current to said radial coil to generate a magnetic field substantially canceling an eddy current field component generated by said inner and outer gradient coil means when said inner coil form is positioned with respect to said outer coil form so that said first isocenter is offset from said second isocenter along either an X-axis or a Y-axis which are mutually orthogonal, and which are both orthogonal to said Z-axis.

3. The system of claim 1 wherein:

the amplitude of said first compensation current is proportional to said offset along said Z-axis; and the amplitude of said second compensation current comprises the sum of first and second current components respectively representing said offset along said X-axis, and said offset along said Y-axis.

4. The system of claim 2 wherein:

said inner and outer gradient coil means respectively comprise inner X-, Y, and Z-gradient coils carried on said inner coil form and outer X-, Y-, and Z-gradient coils carried on said outer form, said inner and outer X-coils, Y-coils, and Z-coils being respectively driven by X-, Y-, and Z-gradient amplifiers to generate respective X-, Y-, and Z-gradient fields in said imaging volume;

said first compensation current has the same waveform shape with respect to time as a driving current produced by said Z-gradient amplifier; and said second compensation current comprises first and second current components having the same waveform shapes with respect to time as driving currents produced by said X- and Y-gradient amplifiers, respectively.

5. The system of claim 4 wherein:

said first and second current components represent said offset of said first isocenter along said X-axis and along said Y-axis, respectively; and said system includes means for summing said first and second current components to provide said second compensation current.

6. A gradient coil system for MR imaging comprising:

a cylindrical outer coil form;

a cylindrical inner coil form positioned within said outer coil form and surrounding an imaging volume;

inner and outer gradient coil means respectively carried on said inner and outer coil forms for collectively generating a specified gradient field pattern in said imaging volume, and a substantially zero field in a region outside said outer coil when said inner and outer coil forms are in specified longitudinal and radial alignment;

a compensation coil arrangement selectively positioned with respect to said inner and outer gradient coil means, said arrangement comprising a longitudinal compensation coil and a radial compensation coil; and longitudinal and radial compensation current sources respectively coupled to said longitudinal and radial compensation coils to apply compensation currents thereto which respectively have a specified relation to longitudinal and radial displacements of said inner coil form from said specified alignment relative to said outer coil form, said longitudinal and radial coils generating corresponding magnetic fields in response to said applied currents which cancel eddy current field components resulting from said longitudinal and radial displacements, respectively.

7. The system of claim 6 wherein:

at least one of said compensation coils is carried on said inner coil form.

8. The system of claim 6 wherein:

at least one of said compensation coils is carried on said outer coil form.

9. The system of claim 6 wherein:

at least one of said compensation coils is carried on a cylindrical coil form positioned in a space between said inner and outer coil forms.

10. The system of claim 6 wherein:

said inner and outer gradient coil means respectively comprise inner x-, y- and z-gradient coils carried on said inner coil form, and outer x-, y- and z-gradient coils carried on said outer coil form, said inner and outer x-coils, y-coils and z-coils respectively generating x-, y- and z-gradient fields in said imaging volume.

11. The system of claim 6 wherein:

said compensation coil arrangement includes at least one compensation coil comprising a number of non-uniformly spaced coil turns.

12. The system of claim 6 wherein:

said compensation coil arrangement includes at least one compensation coil constructed to selectively reverse the sense of a current flowing therethrough.

* * * * *